United States Patent
Trelford et al.

(10) Patent No.: US 9,426,901 B2
(45) Date of Patent: Aug. 23, 2016

(54) PATTERNING METHOD FOR COMPONENT BOARDS

(71) Applicant: General Electric, Schenectady, NY (US)

(72) Inventors: John Andrew Trelford, Dallas, TX (US); William Lonzo Woods, Jr., Kaufman, TX (US); Thang Dahn Truong, Grand Prairie, TX (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 481 days.

(21) Appl. No.: 13/650,988

(22) Filed: Oct. 12, 2012

(65) Prior Publication Data

US 2013/0092721 A1 Apr. 18, 2013

Related U.S. Application Data

(60) Provisional application No. 61/546,417, filed on Oct. 12, 2011.

(51) Int. Cl.
| | | |
|---|---|---|
| *B05D 1/32* | (2006.01) | |
| *H05K 3/10* | (2006.01) | |
| *H05K 3/40* | (2006.01) | |
| *C23C 18/06* | (2006.01) | |
| *H05K 1/11* | (2006.01) | |
| *H05K 3/12* | (2006.01) | |

(52) U.S. Cl.
CPC ............... *H05K 3/4069* (2013.01); *B05D 1/32* (2013.01); *C23C 18/06* (2013.01); *H05K 1/112* (2013.01); *H05K 1/115* (2013.01); *H05K 3/1216* (2013.01); *H05K 2201/0305* (2013.01); *H05K 2203/1476* (2013.01)

(58) Field of Classification Search
USPC ............. 427/97.7, 97.8, 98.4, 98.5, 282, 97.2
See application file for complete search history.

(56) References Cited

U.S. PATENT DOCUMENTS

| | | | | |
|---|---|---|---|---|
| 4,323,593 | A * | 4/1982 | Tsunashima | 427/98.3 |
| 4,604,966 | A | 8/1986 | Kohn | |
| 5,436,028 | A * | 7/1995 | Becher et al. | 427/98.4 |
| 5,593,080 | A * | 1/1997 | Teshima | B23K 3/0638 101/127 |
| 5,635,337 | A * | 6/1997 | Bartha | G03F 7/00 216/18 |
| 5,761,803 | A * | 6/1998 | St. John et al. | 29/852 |
| 5,804,248 | A * | 9/1998 | Hewett | 427/97.2 |
| 6,026,566 | A | 2/2000 | Urban et al. | |
| 6,142,357 | A | 11/2000 | Howell | |
| 6,264,097 | B1 * | 7/2001 | Sano | 228/245 |
| 6,273,327 | B1 * | 8/2001 | Murray et al. | 228/245 |
| 6,857,361 | B2 * | 2/2005 | Sakai et al. | 101/129 |
| 7,036,712 | B2 * | 5/2006 | Joy | H05K 3/3436 174/266 |
| 7,249,558 | B2 | 7/2007 | Claiborne et al. | |
| 7,291,226 | B2 | 11/2007 | Laurer et al. | |
| 7,412,923 | B2 | 8/2008 | Shaeffer et al. | |
| 8,052,881 | B2 * | 11/2011 | Zhu | H05K 3/4617 216/13 |
| 8,230,783 | B2 | 7/2012 | Klauser et al. | |
| 8,230,785 | B2 | 7/2012 | Doyle et al. | |
| 8,420,952 | B2 * | 4/2013 | Nawata | G01R 31/2818 174/255 |

(Continued)

*Primary Examiner* — Brian K Talbot
(74) *Attorney, Agent, or Firm* — General Electric Company

(57) ABSTRACT

A method of printing solder paste in a component board and a stencil set for doing the same are disclosed. In one embodiment, the method includes using a first stencil having a first thickness to print solder paste into at least one through hole in the component board. The method further includes using a second stencil having a second thickness to print solder paste for at least one surface mounted part on the component board, subsequent to using the first stencil.

10 Claims, 7 Drawing Sheets

(56) References Cited

U.S. PATENT DOCUMENTS

| | | | |
|---|---|---|---|
| 2002/0064933 A1* | 5/2002 | Ueoka | 438/615 |
| 2002/0185020 A1* | 12/2002 | Sakai | H05K 3/1225 101/127 |
| 2003/0111518 A1* | 6/2003 | Dances | 228/215 |
| 2008/0146051 A1* | 6/2008 | Honda | 439/66 |
| 2009/0022928 A1* | 1/2009 | Cheng | B23K 1/0016 428/44 |
| 2011/0315028 A1* | 12/2011 | Abe et al. | 101/114 |

* cited by examiner

PATTERNING METHOD FOR COMPONENT BOARDS

CROSS-REFERENCE TO RELATED APPLICATION

This application claims the benefit of U.S. Provisional Application Ser. No. 61/546,417, filed on Oct. 12, 2011, entitled "MODIFY SOLDER PASTE PRINT APPROACH FOR PIN SOLDERING IN REFLOW APPLICATION," commonly assigned with this application and incorporated herein by reference.

TECHNICAL FIELD

This application is directed, in general, to a (e.g. solder) printing, patterning, and/or filling method and apparatus for component boards.

BACKGROUND

Presently, in the board-level circuit and components assembly industry, solder printing techniques utilize one stencil to print solder paste on a printed circuit board (PCB) or to fill through holes in the PCB with solder material (print, fill, sweep, flow, roll, etc., are collectively taken to be a type of "patterning"). Because a vertical depth of the through holes is much greater than a low height of a solder-pad printed on a surface of the PCB, the stencil is expensive and complex to fabricate and then use. It is time consuming to use the stencil during board-level solder patterning because it takes longer to fill a through hole with solder than to print a thin solder pad on the surface of the PCB. Attempts to speed up the process leave solder patterns that are located imprecisely or through holes that have an inadequate amount of solder. Consequently, reducing the manufacturing speed, cost, solder smearing, and increasing the solder-location accuracy would benefit the method and system for patterning solder on a PCB or other types of boards that are used to mount or hold devices. Moreover, any other types of patterning techniques that involve different amounts of material (e.g. inks, pastes, etc.) into or on different surfaces should benefit from the techniques and system described below.

SUMMARY

The embodiments include methods of and apparatuses for patterning solder paste, adhesives, and so on, on and/or into a board using multiple stencils in a particular order to fill through holes with solder and to print solder pads on the board.

For example, the embodiments include a first method using a first stencil that is substantially planar and has one or more through-hole apertures formed therein to print solder paste into the one or more through-holes formed in a component board; and using a second stencil having one or more surface-mounted component apertures, subsequent to using the first stencil, to print solder pads on the component board.

BRIEF DESCRIPTION OF EXEMPLARY DRAWINGS

Reference is now made to the following descriptions taken in conjunction with the accompanying drawings, in which.

DETAILED DESCRIPTION

The disclosure introduces embodiments of multi-stencil processes and equipment to pattern solder and other substances onto and into PCBs for at least surface mount devices and through hole devices. The stencils have apertures through which the solder and other substances would flow and then be deposited on a surface of the PCB or in a through hole or bore hole of the PCB. The order in which the stencils are used provide certain advantages such as improved precision and reduced smearing.

After the component boards have the solder patterns, surface mount devices such as circuits, MEMS, optical elements, etc., are mounted on a surface of one side of a PCB by heating the solder pattern (e.g. pads) and placing the legs or leads of the devices on the heated solder and allowing the solder pads to cool off. Any device that uses these solder pads are referred to as surface mount devices, and the pads are referred to as surface mount or solder pads. Surface-mounted devices can populate one or both sides of the PCB so that there can be surface mount pads patterned on both sides of a PCB. Other types of devices that use the through holes are referred to as through-hole devices, such as small boards, large-sized devices, heat sinks or heat slugs, and power devices, etc., have wire leads or metallic legs that are inserted into the through holes in a PCB by heating and liquefying the patterned solder in the through hole, so that the leads and legs can readily pass through the liquid form of the solder. When the liquid hardens, the metallic leads and legs remain fixed in the solder and these larger devices or power structures remain well-attached to the PCB. The small boards that are to be attached to a larger or mother board have legs that would be inserted and soldered into the through holes of the larger board. The small boards themselves may also have through holes, solder pads, and adhesive pads to attach components to the small board.

Figure 1:
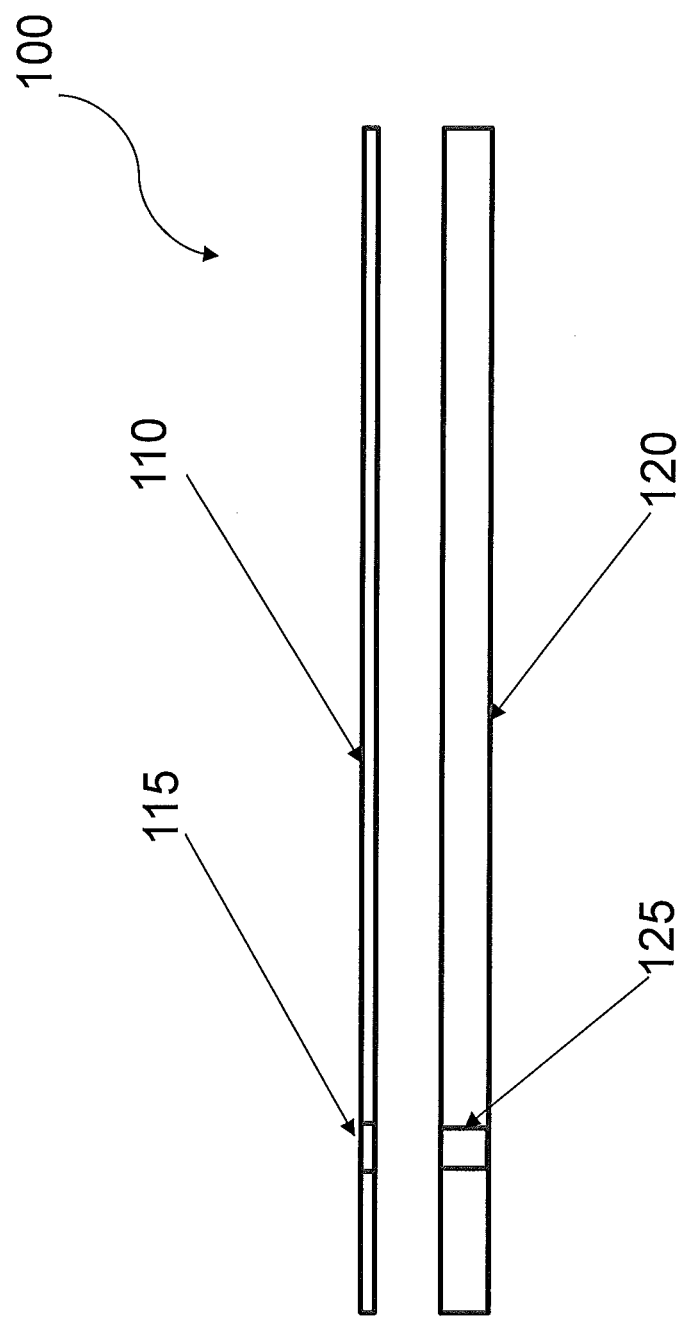
FIG. 1 is a side cross sectional view of an embodiment of a first stencil and a PCB before using the first stencil to pattern solder in a through hole.

Referring to FIG. 1, an embodiment of a first stencil 110 has a first aperture 115 and a PCB 120 has a through hole 125. The first stencil 110 is pre-formed so that it is substantially planar and it has a first aperture 115 substantially aligns or coincides in location with the through hole 125 in the PCB 120. The stencil aperture 115 can be circular, square, regular or irregular shape. In one example, the aperture 115 is larger than the cross-sectional area of the through hole 125. For instance, an area of the aperture 115 is 1-5% larger than an area of the cross-sectional area of the through hole 125. As another example, the first aperture 115 has the same circular shape as a cross-section of the through-hole 125 but with a slightly greater diameter than that of the through hole 125. As yet another example, instead of a particular geometry (e.g. circle or square), the shape of aperture 115 is optimized to deposit solder into the through hole 125 such as by beveling the side wall of the aperture 115 to create a funnel effect for the solder to feed the solder into the hole 125. The PCB 120 used in this embodiment happens to be about 60-90 mils thick, depending on the number of planar layers and the thickness of the ground or power planes used to make the board. As such, the vertical height (depth) of the through hole is also about 60-90 mils, or matches the board thickness. Instead of a through hole, any trenches or bore holes in the PCB 120 can also be filled in the manner described herein.

When the through hole 125 is filled with solder, a small amount of the solder generally may spill over or ooze out above and beyond the lip of the through hole 125, onto a surface of the PCB 120, but contained by the walls of the aperture 115 of the PCB 120. That is, a small collar of solder around the through hole 125 forms on the surface of the PCB 120. In this sense, a small portion of the solder remains and is printed on the PCB 120 within the area of the aperture 115 adjacent to the through hole 125.

While the PCB 120 in FIG. 1 includes a single through hole, alternatively, the PCB 120 often also includes multiple through holes depending on the PCB 120 design and purpose. Alternatively, the through holes are sockets at the corners of the PCB 120 where solder is pushed or flowed into the socket. A pre-determined amount of solder can be pushed/flowed into the socket to either fill the socket or merely coat the walls of the socket. As yet another alternative, flexible electronics or flex circuits are also screen or stencil printed onto polyester-type boards. The wire traces among the flexible electronics or even the connecting legs of a flexible circuit is able to be printed on a polyester-type board in manners similar to those described below for surface mount pads. But if the flexible electronics include vias or other elements of varying depth, these elements may be filled in the manner of a through hole 125.

In one embodiment, through hole 125 is filled with solder paste 250 (FIG. 2), metallic solder such as copper or gold, or is alternatively filled or patterned with other substances such as adhesives or polymers, or other coatings. The choice of adhesives can include a substance that hardens when cooled or when coated with some other chemical compound.

In an exemplary embodiment, the first stencil 110 has a thickness of about 2-8 mils and is made of nickel, a nickel alloy or steel. In the next process iteration, the thickness of the first stencil 110 should become less than 5 mils. The thickness of a stencil plays a role in controlling the volume of solder paste 250 that fills a through hole 125. Thus, a thicker stencil aids introducing more solder into a through hole 125. Additionally, the relative thickness of the first stencil 110 and the subsequent stencils plays a role in governing the precision with which the through holes 125 are filled as opposed to the precision with which surface mount pads are printed. Or in addition to precision issues, a thinner stencil can be used to print solder pads 520 (see FIG. 6) to attach smaller devices with finer geometries that benefit from more precision printing. One embodiment is to make a stencil thicker if the stencil is used to fill through holes 125 or to print material (e.g. solder paste, a sticky mixture of solder and flux) of a large depth, and to make any stencil thinner if it is used to print solder pads 520 or substances having a thin depth or to mount smaller devices. Alternatively, the first stencil 110 and subsequent stencils are of comparable thickness to improve manufacturability and reduce costs—e.g., a machinery to fabricate the stencils can be set at a single operating point to make stencils of similar thicknesses. As yet another alternative, the embodiments described herein achieve precision patterning without specific requirements on the thicknesses of the one stencil, or the relative thicknesses of the multiple stencils. For example, if older stencils of a particular thickness already exist, it would not be necessary to machine a new version of the older stencil. Thus, it is also possible to achieve precision patterning if the first stencil 110 is thinner than the subsequent stencils.

Figure 2:
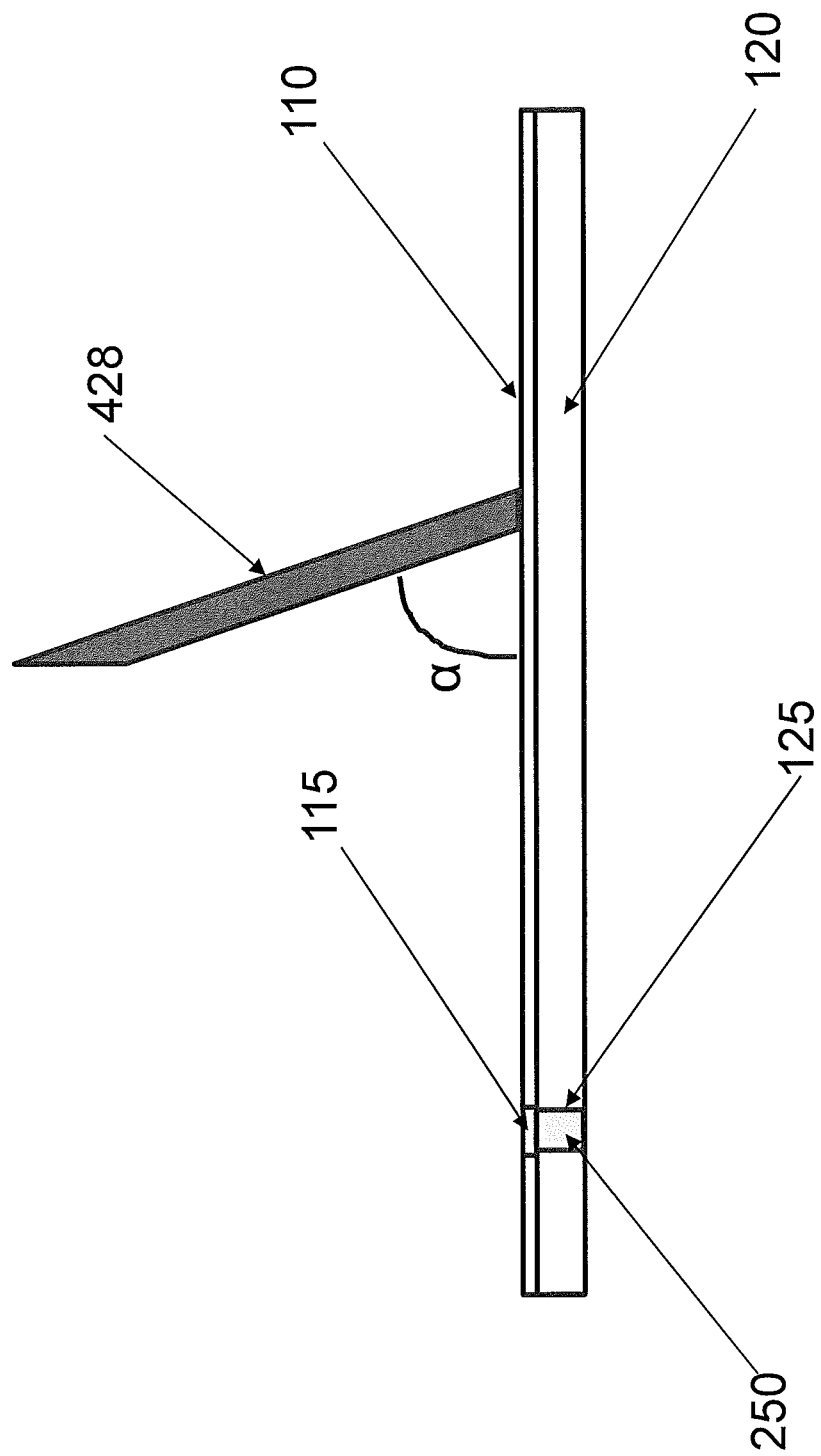
FIG. 2 is a side cross sectional view of an embodiment of the PCB while using the first stencil.

FIG. 2 provides a side cross sectional view of the first stencil 110 and the PCB 120 while printing solder material (e.g. solder paste 250) through the first stencil 110 and then into the through hole 125. The first stencil 110 is positioned on top of and in contact with the PCB 120 so that an aperture 115 in the first stencil 110 is substantially aligned with the through hole 125. There is a squeegee blade 428 that is part of a solder dispenser and sweeper equipment that are not shown. The squeegee blade 428 that forms an acute angle α between the squeegee blade 428 and a horizontal surface of the first stencil 110. Solder paste 250 is located on the acute-angle side between the squeegee blade 428 and the substantially planar first stencil 110. The squeegee blade 428 sweeps or moves back and forth across a top surface of the first stencil 110 to move or spread solder across the top surface. Where there is an aperture (e.g. 115) in the stencil 110, the solder paste 250 will be pushed into the aperture 115 and further down into any through holes 125 or trenches that coincides with aperture 115. Depending on a thickness of the first stencil 110 and a fluidity or viscosity of the solder, along with other factors such as speed, the printing with the first stencil 110 ("first printing") may include multiple sweeps before the through-hole 125 is filled with enough solder paste 250. In addition, the precision (as well as speed) of printing or patterning solder depends on other factors such as the number of sweeps and on an angle α between the squeegee blade 428 and a surface of the first stencil 110. The squeegee blade 428 prints or pushes solder onto the PCB 120 at an angle α of about 30 to 60 degrees, which was found to be optimal for purposes of speed and quality of the solder printing. Alternatively, when the angle α is between 50 to 75 degrees, it is easier for other purposes such as accommodating multiple squeegees and increasing the amount of solder used to fill the through holes 125. The angle α can be adjusted to push more or less solder paste 250 in the apertures 115 in the first stencil 110 and similarly for subsequent stencils.

In another embodiment, the first stencil 110 can still work to print surface pads or solder pads 520 on the surface of the PCB 120. For instance, instead of multiple sweeps of the squeegee blade 428, fewer sweeps are performed to print solder pads 520 using the first stencil 110. Or, the number of sweeps are varied or split so that over the PCB 120 area where the surface mounted devices are located, there are fewer sweeps. But over the deep trenches or through holes 125 that are to be filled with solder, there are multiple sweeps of the squeegee blade 428.

In FIG. 2, the first stencil 110 is positioned on top of and adjacent to the PCB 120 and pressed down with enough pressure to prevent the solder paste 250 from smearing between the first stencil 110 and the PCB 120 by leaving substantially no air gaps and by contacting the first stencil 110 to the PCB 120 directly. Otherwise some of the solder paste 250 may ooze or seep underneath the first stencil 110 during the patterning process. In one embodiment, a thinner stencil 110 with a thickness below 5 mils provides improved smearing control since a thinner stencil is less prone to being warped or stressed if the thinner stencil is made of certain materials such as nickel alloy or steel. The first stencil 110 is malleable or flexible enough to bend when pressure is applied so as to avoid a permanent crease or crack.

The example of FIG. 2 shows the solder paste 250 printed into the through-hole 125. While FIG. 2 shows that the solder paste 250 is filled to a top surface level of the first stencil 110, alternatively, solder paste 250 only partly fills the through hole 125 or the aperture 115. As another alternative, for very deep trenches or through holes 125 that require large amounts of solder paste 250, more fluid solder is flowed across the top surface level of the first stencil 110. Fluid solder would flow down any apertures 115 of the first stencil 110 and down to through holes 125. As yet another alternative, the squeegee blade 428 pressure is adjusted to increase (or decrease) a pumping pressure exerted on the solder paste 250 to push the paste 250 through the stencil aperture 115 and down to through holes 125. Or, a support fixture for the sweeper equipment is programmed to provide a vacuum source capable of supplementing the pumping action of a print/pattern cycle drawing the solder paste 250 into the through hole 125 while the squeegee blade 428 pumps material into the hole 125.

Printing solder paste 250 into the through-hole 125 by multiple sweeps allows the solder paste 250 to be cumulated gradually (after each sweep). The placement of solder paste 250 tends to be precise and does not overflow or flow out during any subsequent reflow procedures to temporarily attach components to the solder pads 520. Overflow or unintentionally-extended solder paste 250 may cause shorts and other connection problems for nearby components, especially in a densely populated PCB.

Figure 3:
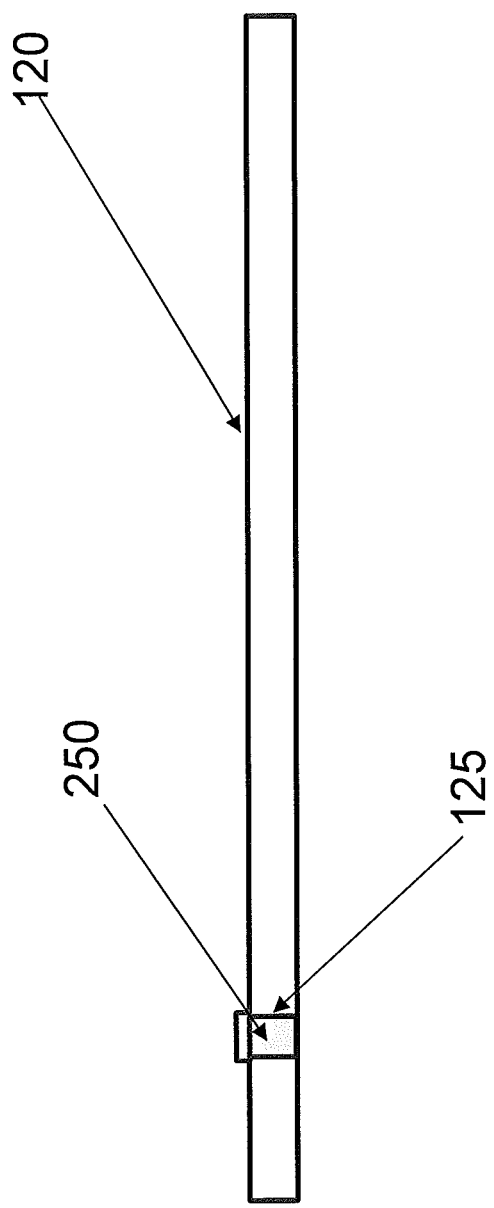
FIG. 3 is a side cross sectional view of an embodiment of the PCB after using a first stencil.

FIG. 3 provides a view of the PCB 120 after the first stencil 110 is removed from the PCB 120. In this example, the printed solder paste 250 protrudes above the top surface of the PCB 120 by about a few mils or by a thickness of the first stencil 110. The first stencil 110 may be re-used in printing through holes for other PCBs that share the same through hole 125 pattern. Multiple PCBs can share through hole design patterns, especially for PCBs for similar products or applications.

Figure 4:
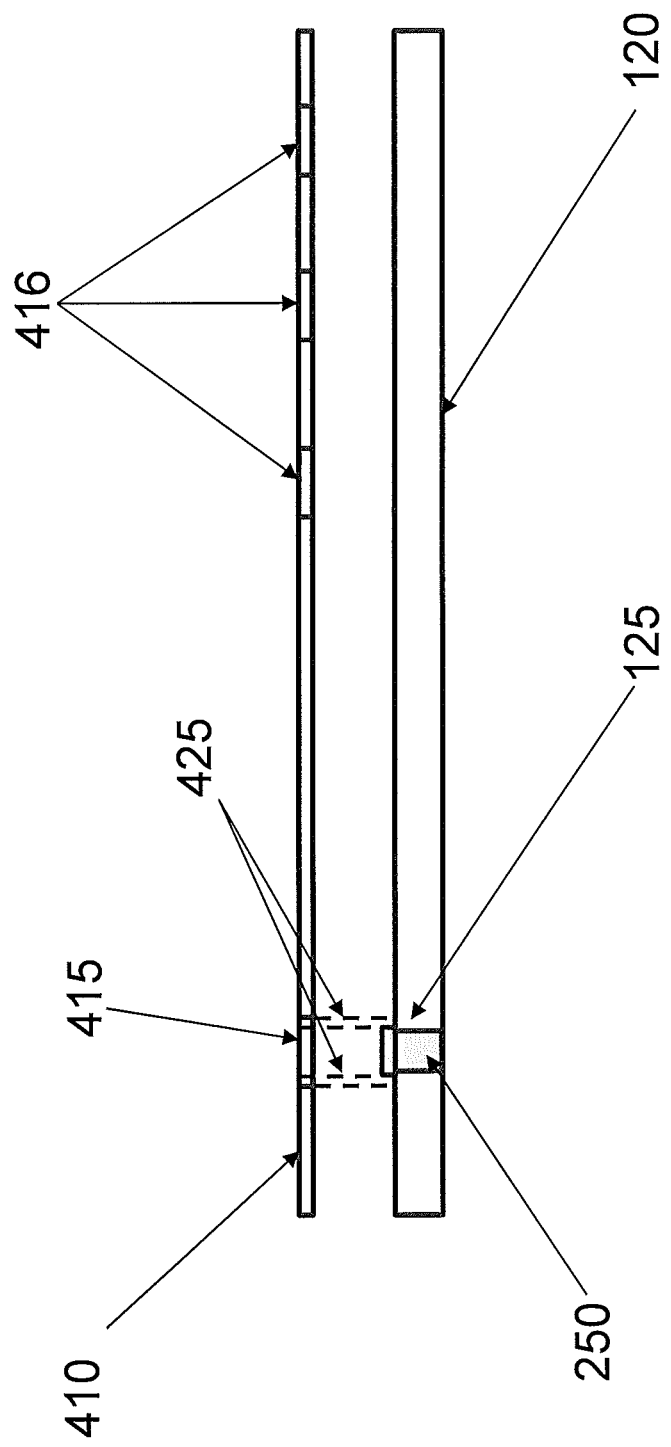
FIG. 4 is a side cross sectional view of an embodiment of a second stencil and the PCB before using the second stencil.

FIG. 4 depicts an embodiment of a second stencil 410 and the PCB 120. The second stencil 410 includes a second aperture 415 that clears or encompasses a cross sectional area of solder paste 250 by a pre-determined clearance distance 425. For example, a cross sectional area of the second aperture 415 is somewhat bigger than a cross sectional area of the through hole 250 or somewhat bigger than the cross sectional area of the aperture 115 on the first stencil 110 (or any stencils preceding the second stencil 410). If the second aperture 415 is circular, it is concentric with or encompasses the through-hole 125 and has a diameter slightly greater than a diameter of the through hole 125 in the PCB 120. In one embodiment, the second aperture 415 is sized to clear by at least 10 mils. If there are more than two stencils, a number N of stencils are used with each subsequent stencil having apertures that clear the already-patterned material that was previously deposited on the PCB 120. As an alternative, there is some overlap in the materials used in the first and subsequent printings. For example, the aperture 415 has a geometry or a diameter such that the boundary of 415 overlaps with or gaskets the material that was already deposited in a previous print of solder. Additionally, instead of being circular, the second aperture 415 is of any geometrical shape as well as the circular or square shape that matches most cross sectional geometries of through holes 125.

The second stencil 410 also includes any number of surface mount apertures 416 to print solder pads 520 or wire traces on the top or a bottom surface of the PCB 120. These surface solder pads 520 or wire traces can be used to attach surface mount devices. The solder pads 520 often have a low profile and do not require much solder to form the solder pads 520. Alternatively, the second stencil 410's surface mount apertures 416 are used to pattern or fill hole pads (not shown) that are more shallow in depth as compared with through holes 250 and that do not need as much solder paste 250. For densely populated PCBs 120, the surface mount parts include fine-pitch components such as those with lead pitches of 20-25 mils or less.

In the example of FIG. 4, the second stencil 410 includes three surface mount apertures 416 for printing solder pads 520. Although not shown, a matching number, three copper pads are provided on the surface of PCB 120 so that solder paste 250 is deposited on the three copper pads to form solder pads 520. The cross sectional shape of the surface mount apertures 416 is of any geometrical shape, although most solder pads 520 are circular or rectangular in practice. Again, the number of second apertures 415 and the surface mount apertures 416 for solder pads 520 is not limited by the number shown in FIG. 4.

In one embodiment, the second stencil 410 is about 2-5 mils thick or less and made of nickel, nickel alloy or steel, and so on. The second stencil 410 is substantially planar or at least conforms to a planarity geometry of the PCB 120. In one embodiment, the second stencil 410 has a thickness that is equal to or less than a thickness of the first stencil 110 for some of the aforementioned reasons related to precision, print quality and stencil flexibility. Although stencil 410 is referred to as the second stencil, in other scenarios, it is used as a first stencil for a bottom or second side of the PCB 120.

Figure 5:
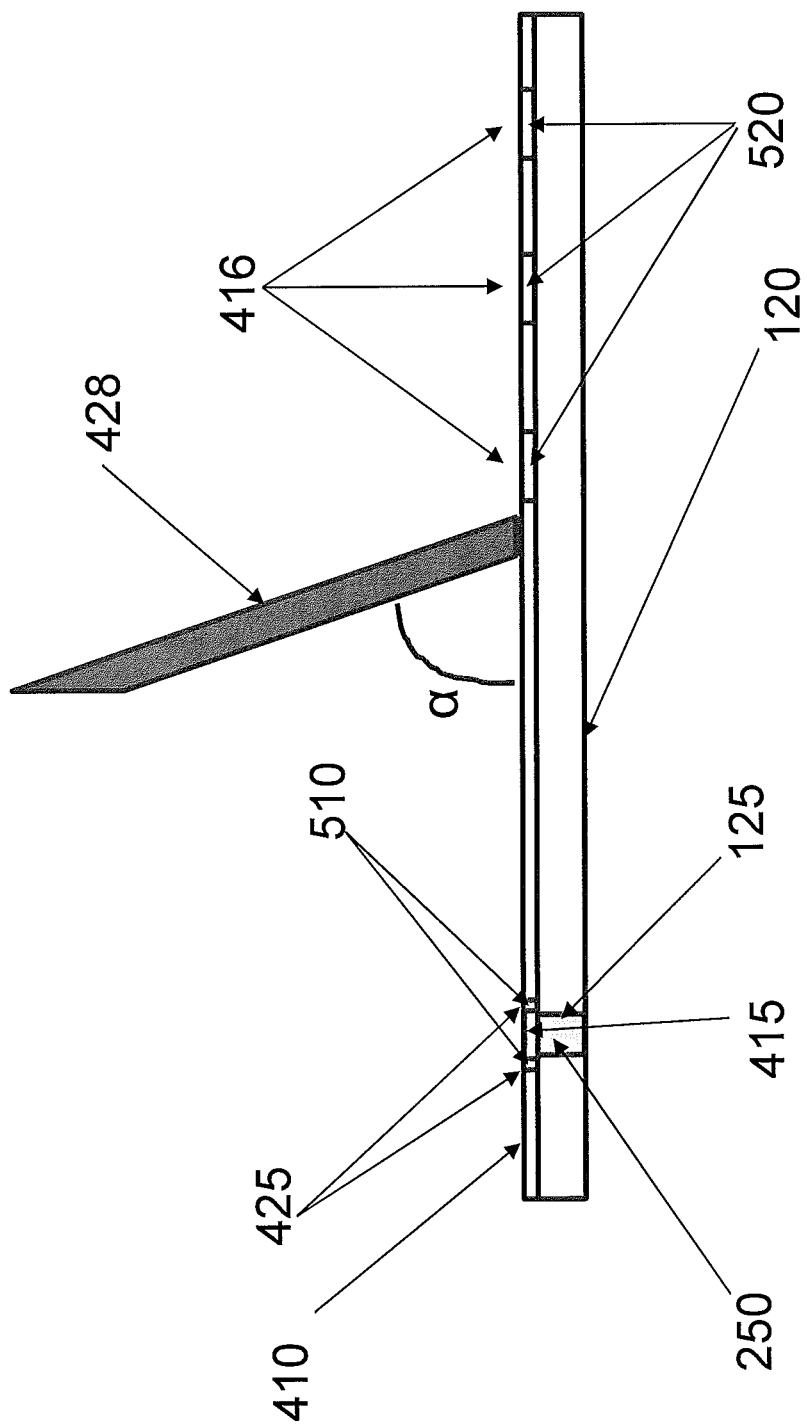
FIG. 5 is a side cross sectional view of an embodiment of the second stencil and the PCB while using the second stencil.

FIG. 5 provides a view of the second stencil 410 and the PCB 120 during the printing of solder paste 510, solder pad 520 by sweeping or rolling the squeegee blade 428 across the second stencil 410. Second stencil 410 is placed and pressed firmly in direct contact against the top surface of PCB 120 to prevent the solder paste 510 and solder pads 520 from smearing between the stencil 410 and the top surface of PCB 120. For certain types of precision patterning, the pressure applied to the second stencil 410 is larger than the pressure applied to the first stencil 110. In one embodiment, the subsequent or second printing using a second stencil 410 includes only a single sweep of the squeegee blade 428 because this provides enough solder paste 250 to form the solder pads 520 or to fill the volume of the surface mount apertures 416. Alternatively, subsequent patterning includes two or more sweeps of the squeegee blade 428 to deposit solder paste 250, depending on the thickness of the second stencil 410 and the viscosity of the solder paste 250. Such multiple sweeps would not compromise the structural integrity of the second stencil 410 if the pressure applied to the squeegee blade 428 is optimized for the material of the stencil 410 and the type of substance deposited by the squeegee blade 428.

During the subsequent (e.g. second) printing, using the second stencil 410, solder paste 510 and solder pads 520 are deposited through the apertures 415 and 416, respectively. For the through-hole 125, an additional layer (i.e., annular ring) of solder paste 510 is printed in the area straddled by the clearance distance 425 on top of the existing solder paste 250. The additional layer of solder paste 510 fills in the second aperture 415. Alternatively, the amount of solder paste 510 is adjusted to only coat a vertical wall of the aperture 415 in order to form only a ring on the top surface of the PCB 120, where the ring is concentric with the cross section of the through hole 125 (a "collar"). The surface mount apertures 416 are filled for the first time with solder paste 250. Solder paste 510 and solder pad 520 fill a volume that reaches up to a top surface level of the second stencil 410.

Figure 6:
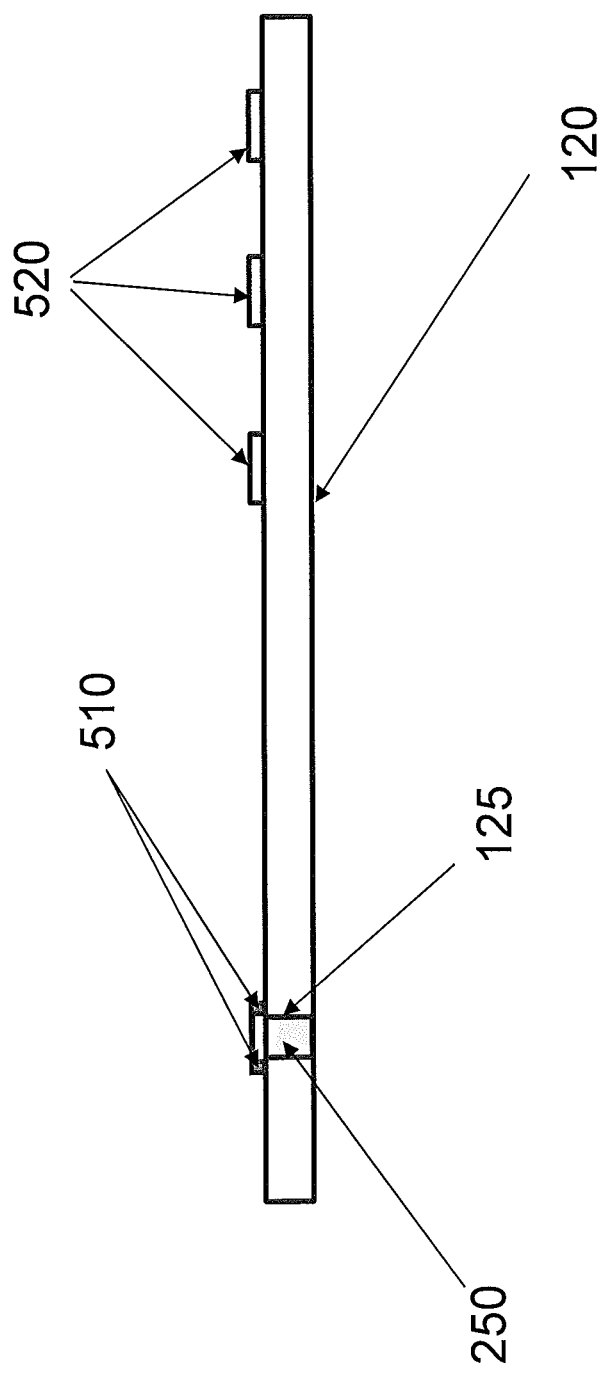
FIG. 6 is a side cross sectional view of an embodiment of the PCB after using the second stencil.

FIG. 6 provides a side cross sectional view of the PCB 120 after the second stencil 410 is removed. A vertical height of the solder pastes 250 and 510, for the through hole 125 and aperture 415, respectively, protrude up above the top surface of the PCB 120 by substantially the same amount and is comparable to the thickness of the second stencil 410. After the surface mount devices and through hole devices are attached onto the respective solder pad 520 and solder paste 510, the PCB 120 is transferred into a reflow soldering oven for a reflow process.

Figure 7:
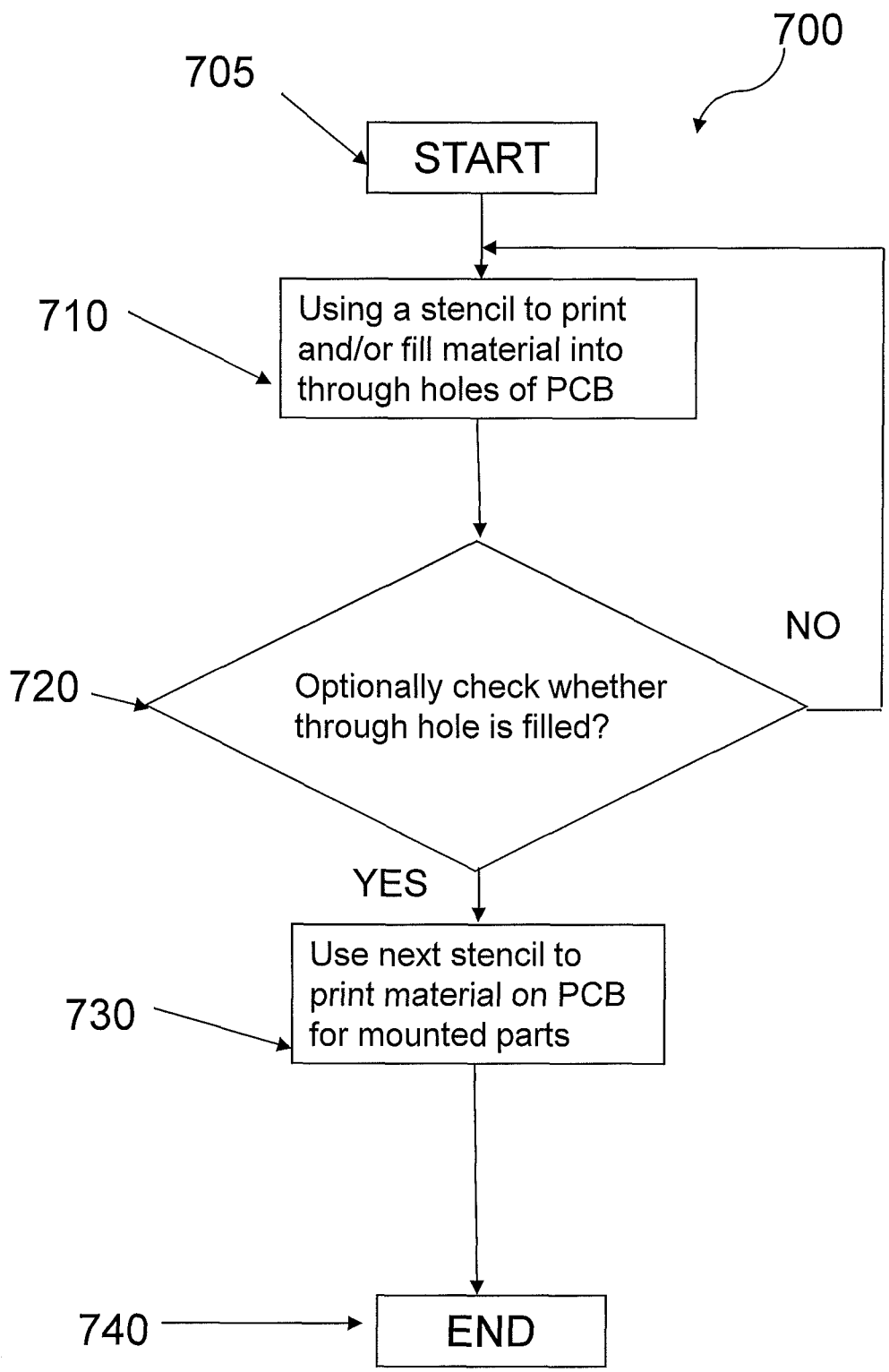
FIG. 7 is a flow diagram of an embodiment of a method for patterning solder paste on or into a PCB.

FIG. 7 provides a flow diagram of the claimed method 700 for patterning solder paste into or on a component board such as PCB 120. PCB 120 is patterned with solder by using a first stencil 110 to fill the deep-height PCB apertures such as the through holes 125 with a solder material. The first stencil 110 has apertures 115 through which the solder flows down into the through holes 125. Then the second stencil 410 is subsequently used to print low-height solder pads 520 on either or both surfaces of the PCB 120. Alternatively, the second stencil 410 is used to fill hole pads (not shown) that are more shallow than through holes 125 such that less solder is needed to fill the hole pads. Solder again flows through apertures 426 down to the surface of PCB 120. Other types of component boards also benefit from these techniques to quickly and more precisely pattern solder or other materials on or into the component board.

In FIG. 7, the claimed method 700 starts at block 710, using a first stencil having a first thickness to fill solder paste into at least one through hole 125 in the PCB 120. For example, a squeegee blade 428 or solder roller pushes solder paste into apertures 115 in the first stencil 110, as the squeegee blade 428 sweeps across the top of the first stencil 110. Alternatively, two or more squeegee blades 428 or rollers are used to increase the manufacturing speed. For instance, if a PCB 120 is to be populated with rows of components and there happens to be a channel between two adjacent rows, then two squeegee blades 428 are rolled across a portion of the stencils 110 or 410 on either side of the channel. At procedure 720, a determination is made whether the volume of the solder paste 250 fills the through hole 125. If the answer is negative, the method 700 returns back to block 710. This local return loop is repeated until the volume of the solder paste at least fills the through hole. Procedure 720 is optional. For example, during the actual manufacturing process, the needed volume of solder paste 250 has already been pre-determined during the optimization of method 700 so that it should not be necessary to apply procedure 720. But during the optimization or setting up of method 700, procedure 720 is run in order to determine the amount of material needed to fill a through hole having a particular depth or height. Regardless, if procedure 720 is by-passed or if the answer from procedure 720 is positive, the method 700 continues to procedure 730, using a second stencil 410 having a second thickness to print solder paste 250 for at least one surface mounted part on the PCB 120. In another instance, the second stencil 410 or subsequent stencils is optimized to fill shallow hole pads or bore holes in the PCB 120 with solder paste 250. Alternatively, the first and second stencils (110, 410) are used on opposite sides (top and bottom) of the PCB. As another alternative, a third stencil is used after the first two to pattern solder pads 520 on the bottom side of the PCB so that additional parts can be soldered or surface mounted to the bottom side of the PCB 120. Or, subsequent stencils having notches that are deep enough to clear previously-laid down solder, are applied after the first and second stencils. These and other additional stencils are used to print more solder patterns or non-solder-material (e.g. adhesives) patterns to enable the attaching of optical devices or other components to a component board, by using an attachment procedure other than solder pads 520 and through holes 125.

As another alternative, different materials are deposited in blocks 710 and 730. For example, the first pattern using the first stencil 110 deposits a solder with a higher metallic content, epoxy flux or other specialized substance. Then the second patterning in block 730 uses solder paste 250, or vice versa in the order of substances deposited. Method 700 ends in at block 740, for example, when the board-level fabrication is complete.

Those skilled in the art to which this application relates will appreciate that other and further additions, deletions, substitutions, modifications or extensions may be made to the described embodiments. For example, although reference is made to a printed circuit board. Flexible circuit "boards" or component surfaces should also benefit from these embodiments. The material used to form the patterns may also be something other than solder material. For example, a polymer adhesive or sealant or other material can be patterned onto a board. Moreover, although words such as "top" and "bottom" are used in the foregoing descriptions, other spatial orientations are equivalent because, for example, a component board may be turned on its side or upside down.

What is claimed is:

1. A method of printing solder paste in a component board, the method comprising:
   using a first stencil having a first thickness to pattern solder paste into at least one through hole in the component board, the first stencil defining at least one first aperture; and
   using a second stencil subsequent to using said first stencil to print solder paste for at least one surface mounted part on the component board, said second stencil separate from the first stencil and having a second thickness less than or equal to the first thickness, the second stencil defining at least one surface mount aperture and at least one second aperture, the at least one second aperture being concentric with the at least one through hole and having a diameter greater than a diameter of the at least one through hole;
   wherein using the first stencil includes placing the first stencil on a surface of the component board and printing solder paste through the at least one first aperture, and wherein using the second stencil includes placing the second stencil on the surface of the component board and printing solder paste through the at least one surface mount aperture and through the at least one second aperture.

2. The method of claim 1, wherein each of said first and second thickness is less than 6 mils.

3. The method of claim 1, wherein using said first stencil includes printing said solder paste into said at least one through hole multiple times until a volume of said solder paste fills said at least one through hole.

4. The method of claim 1, wherein said first stencil and said second stencil are made of nickel or nickel alloy.

5. The method of claim 1, wherein a diameter of said at least one aperture in said second stencil is slightly greater than a diameter of said at least one through hole.

6. The method of claim 1, wherein said at least one first aperture is concentric with said at least one through hole.

7. The method of claim 1, wherein using said second stencil includes printing said solder paste through said at least one aperture into said at least one through hole.

8. The method of claim 6, wherein said at least one second aperture has a diameter greater than a diameter of said at least one first aperture, wherein the at least one surface mount aperture is located over a portion of copper pad for said at least one surface mounted part.

9. The method of claim 1, wherein the second thickness is less than the first thickness.

10. The method of claim 1, wherein the first thickness is between about 2 mils and about 8 mils, and the second thickness is between about 2 mils and about 5 mils.

\* \* \* \* \*